United States Patent
Ghosh (10) Patent No.: US 11,369,050 B2
(45) Date of Patent: Jun. 21, 2022

(54) HIGH FREQUENCY ELECTROMAGNETIC INTERFERENCE (EMI) COMPOSITES

(71) Applicant: 3M INNOVATIVE PROPERTIES COMPANY, St. Paul, MN (US)

(72) Inventor: Dipankar Ghosh, Oakdale, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 504 days.

(21) Appl. No.: 15/579,077

(22) PCT Filed: Jun. 2, 2016

(86) PCT No.: PCT/US2016/035378
§ 371 (c)(1),
(2) Date: Dec. 1, 2017

(87) PCT Pub. No.: WO2016/200662
PCT Pub. Date: Dec. 15, 2016

(65) Prior Publication Data
US 2018/0177081 A1    Jun. 21, 2018

Related U.S. Application Data

(60) Provisional application No. 62/172,841, filed on Jun. 9, 2015.

(51) Int. Cl.
*H05K 9/00*    (2006.01)

(52) U.S. Cl.
CPC ........... *H05K 9/009* (2013.01); *H05K 9/0083* (2013.01)

(58) Field of Classification Search
CPC .... H05K 9/009; H05K 9/0083; H05K 9/0081; C04B 14/026; C08K 3/041
See application file for complete search history.

(56) References Cited

U.S. PATENT DOCUMENTS 7,641,829 B2 *  1/2010  Liang ............... B82Y 30/00
                                                    264/140
8,325,079 B2   12/2012  Shah
(Continued)

FOREIGN PATENT DOCUMENTS

CN    102382468 A    3/2012
WO    2011-109480    9/2011
(Continued)

OTHER PUBLICATIONS

Tamboli, Mohaseen S., et al. "Polymethyl methacrylate (PMMA)-bismuth ferrite (BFO) nanocomposite: low loss and high dielectric constant materials with perceptible magnetic properties." Dalton Transactions 43.35 (2014): 13232-13241. (Year: 2014).*

(Continued)

*Primary Examiner* — Galen H Hauth
(74) *Attorney, Agent, or Firm* — Yufeng Dong (57) ABSTRACT

Electromagnetic interference (EMI) shielding composites and methods of producing the same are described. Carbon nanostructure (CNS) fillers including cross-linked carbon nanotubes (CNTs) and a polymeric encapsulation material are provided, where the carbon nanotubes are encapsulated by the polymeric encapsulation material. The CNS fillers are treated to remove at least a portion of the polymeric encapsulation material. After removing the polymeric encapsulation material, the CNS fillers are mixed with a curable matrix material to obtain EMI shielding composites. In some cases, the removal of the polymeric encapsulation material results in diminished dielectric polarization characteristics for the composites.

11 Claims, 2 Drawing Sheets

(56) References Cited

U.S. PATENT DOCUMENTS

| | | | | |
|---|---|---|---|---|
| 9,327,979 | B1* | 5/2016 | Gopalan | C01B 32/172 |
| 2002/0046872 | A1* | 4/2002 | Smalley | D01F 11/14 |
| | | | | 174/137 A |
| 2010/0108956 | A1* | 5/2010 | Miyazawa | H05K 9/0083 |
| | | | | 252/574 |
| 2010/0189625 | A1* | 7/2010 | Hisashi | B82Y 30/00 |
| | | | | 423/415.1 |
| 2011/0201731 | A1* | 8/2011 | Korzhenko | C08J 3/203 |
| | | | | 524/127 |
| 2011/0216476 | A1 | 9/2011 | Fleischer | |
| 2011/0297892 | A1 | 12/2011 | Shah | |
| 2014/0151111 | A1 | 6/2014 | Shah | |

FOREIGN PATENT DOCUMENTS

| | | |
|---|---|---|
| WO | 2012-040038 | 3/2012 |
| WO | 2013-153255 | 10/2013 |
| WO | 2013-154871 | 10/2013 |
| WO | 2013-184285 | 12/2013 |
| WO | 2014-130431 | 8/2014 |
| WO | 2015-094915 | 6/2015 |

OTHER PUBLICATIONS

"CNS Encapsulated flakes", Applied Nano Structured solution (ANS), retrieved from internet on Jan. 22, 2018, [URL: http://www.appliednanostructuredsolutions.com/wp-content/uploads/2014/09/ANS_flake_Fact_Sheet_8-26-2014.pdf], 2pages.

Ansari, "Functionalized Graphene Sheet—Poly(vinylidene fluoride) Conductive Nanocomposites", Journal of Polymer Science: Part B: Polymer Physics, 2009, vol. 47, pp. 888-897.

Baeumer, "Tunable Carrier Type and Density in Graphene/PbZr0.2Ti0.8O3 Hybrid Structures through Ferroelectric Switching", Nano Lett., 2013, vol. 13, pp. 1693-1698.

Barba, "Carbon black/silicone rubber blends as absorbing materials to reduce Electro Magnetic Interferences (EMI)", Polymer Bulletin, 2006, vol. 57, pp. 587-593.

Chung, "Electrical permittivity and conductivity of carbon black-polyvinyl chloride composites" J. Appl. Phys., 1982, vol. 53, No. 10, pp. 6867-6879.

Dang, "Dielectric properties of upright carbon fiber filled polyvinylidene fluoride . . . composite with low percolation threshold and weak temperature dependence", Appl. Phys. Lett., 2007, vol. 91, pp. 072912-2-3.

Eswaraiah, "Functionalized Graphene—PVDF Foam Composites for EMI Shieldinga", Macromol. Mater. Eng. 2011, vol. 296, pp. 894-898.

Gregorio, Jr, "Effect of crystalline phase, orientation and temperature on the dielectric properties of poly (vinylidene fluoride) (PVDF)", Journal of Materials Science, 1999, vol. 34, pp. 4489-4500.

Guang-Xinni, "Graphene Ferroelectric Hybrid Structure for Flexible Transparent Electrodes", ACS Nano, 2012, vol. 6, No. 5, pp. 3935-3942.

Kozako, "Effects of Nano-Alumina Hydrate Coating for Conductive Fillers on Dielectric Properties of Epoxy Composite Materials", Proceedings of 2014 International Symposium on Electrical Insulating Materials (ISEIM), 2014, p. 77-80.

Li, "High-k polymer/carbon nanotube composites based on a polyhedral oligomeric silsesquioxane matrix facilitated by ionic liquid", J. Mater. Chem. C, 2014, vol. 2, pp. 8216-8221.

Nanda, "Dielectric Relaxation of Conductive Carbon Black Reinforced Chlorosulfonated Polyethylene Vulcanizates", Polymer Composites, 2010, pp. 152-162.

Novoselov, "A roadmap for graphene", Nature, 2012, vol. 490, pp. 193-200.

Wang, "Dielectric Properties of Electrospun Barium Titanate Fibers/Graphene/Silicone Rubber Composites", IEEE, 2011, pp. 640-643.

International Search report for PCT International Application No. PCT/US2016/035378 dated Aug. 31, 2016, 4 pages.

* cited by examiner

HIGH FREQUENCY ELECTROMAGNETIC INTERFERENCE (EMI) COMPOSITES

CROSS REFERENCE TO RELATED APPLICATIONS

This application is a national stage filing under 35 U.S.C. 371 of PCT/US2016/035378, filed Jun. 2, 2016, which claims the benefit of U.S. Application No. 62/172,841, filed Jun. 9, 2015, the disclosure of which is incorporated by reference in its/their entirety herein.

TECHNICAL FIELD

The present disclosure relates to high frequency electromagnetic interference (EMI) composites and methods of making the same.

BACKGROUND

Electromagnetic interference (EMI) shielding of electronic devices and/or radiation sources is an important consideration in the reliable operation of devices. EMI shielding may be achieved by reflection of the electromagnetic (EM) wave, absorption of the wave, or both. It is most common for a highly conductive metal sheet (known as an EM shield) to be used to reflect undesired EM waves. However, in some cases, reflecting the EM waves is not sufficient or may cause further problems. This leads to the requirement for providing EMI shielding materials and methods for absorbing EM waves, especially in the higher frequency regime, for example, 1-40 GHz or 1-80 GHz.

SUMMARY

Briefly, in one aspect, the present disclosure describes methods include providing carbon nanostructure (CNS) fillers including a plurality of cross-linked carbon nanotubes and one or more polymeric encapsulation materials. The carbon nanotubes are at least partially encapsulated by the one or more polymeric encapsulation materials. At least a portion of the polymeric encapsulation materials is removed from the CNS fillers. After the removal of the polymeric encapsulation material, the CNS fillers are dispersed in a curable matrix material to obtain an electromagnetic interference (EMI) shielding composite.

In another aspect, the present disclosure describes methods of adjusting properties of an original EMI shielding composite. The original EMI shielding composite includes carbon nanostructure (CNS) fillers and a matrix material. The CNS fillers are distributed within the matrix material. The CNS fillers include a plurality of cross-linked carbon nanotubes and a polymeric encapsulation material encapsulating at least some of the carbon nanotubes. The methods include providing the CNS fillers including the carbon nanotubes and the polymeric encapsulation material, treating the CNS fillers with a solvent to remove at least a portion of the polymeric encapsulation material from the CNS fillers, and mixing the CNS fillers with the matrix material to obtain a modified EMI shielding composite after removing the polymeric encapsulation material. The modified EMI shielding composite includes about 0.1 to about 5 wt % of the treated CNS fillers dispersed in the matrix material.

Various unexpected results and advantages are obtained in exemplary embodiments of the disclosure. One such unexpected results of exemplary embodiments of the present disclosure is that the removal of polymeric encapsulation material from the CNS fillers by treating the CNS fillers decreases the dielectric polarization (and therefore permittivity values) of the composite including the treated CNS fillers. It is well known in the literature that an electrically insulating polymer encapsulation material on a conductive filler will decrease the dielectric polarization thus leading to lowering of dielectric permittivity values ($\varepsilon'$ and $\varepsilon''$ values).

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should understood that:

The term "homogeneous" means exhibiting only a single phase of matter when observed at a macroscopic scale.

The terms "(co)polymer" or "(co)polymers" includes homopolymers and copolymers, as well as homopolymers or copolymers that may be formed in a miscible blend, e.g., by coextrusion or by reaction, including, e.g., transesterification. The term "copolymer" includes random, block and star (e.g. dendritic) copolymers.

The term "carbon nanostructure" or "CNS" refers to carbon nanotubes (CNTs) that are organized in a cross-linked network.

The term "polymeric encapsulation material" refers to polymeric material that at least partially encapsulates CNTs.

The term "curable matrix material" refers to a polymeric material that can be thermally or optically cured, and after curing the polymeric material forms a cured polymeric body which serves as a matrix body to host fillers or additives embedded therein.

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

The terms "about" or "approximately" with reference to a numerical value or a shape means+/− five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Carbon nanostructure (CNS) encapsulated flakes are a form of carbon nanotubes (CNTs) including cross-linked multiwall carbon nanotube-based networks of CNS. In some embodiments, carbon nanotubes of CNS encapsulated flakes can be compounded by various polymeric encapsulation materials such as, for example, polyurethane (PU), polyethylene glycol (PEG), polyamide (PA), etc. In the CNS encapsulated flakes, the carbon nanotubes can be at least partially encapsulated by the polymeric encapsulation material. In some embodiments, about 50% or more, about 70% or more, about 90% or more, or about 95% or more of the surface area of cross-linked network of carbon nanotubes can be covered by the polymeric encapsulation material. In some embodiments, the CNS flakes can include, for example, about 1 wt % to about 20 wt %, about 2 wt % to about 10 wt %, or about 3 wt % to about 5 wt % of the polymeric encapsulation material.

CNTs in the CNS encapsulated flakes can exhibit metallic or semiconducting behavior with an electrical resistivity in the range, for example, from about $1\times10^{-8}$ to about $1\times10^{-2}$ Ω-cm at room temperature. CNTs can have desirable electromagnetic absorption properties, for example, being capable of absorbing electromagnetic radiation and dissipating the absorbed energy in a host polymer matrix. The polymeric encapsulation material may be electrically insulating with an electrical resistivity in the range, for example, from about $1\times10^{2}$ to about $1\times10^{20}$ Ω-cm.

In some embodiments, the CNS encapsulated flakes can be dispersed in a curable matrix material to form EMI shielding composites that may impart EMI absorbing properties from the CNTs dispersed therein. The formed EMI shielding composites may include, for example, about 0.05 to about 10 wt %, about 0.1 to about 5 wt %, or about 0.2 to about 2 wt % of CNS fillers such as the CNS encapsulated flakes or powders. The EMI shielding composites may include, for example, 5 wt % or less, 3 wt % or less, 1 wt % or less, or even 0.5 wt % or less of the CNS fillers to exhibit desired EMI absorbing properties. The curable matrix material can include, for example, epoxy, silicone, polycarbonate, polyester, polyurethane resin, etc. The curable matrix material can be cured by, for example, radiation or heating, to form a radiation cured polymeric body or a thermally cured polymeric body.

In some embodiments, CNS encapsulated flakes can have an average length of about 10 microns to about 500 microns, and an average thickness of about 1 micron to about 50 microns. In some embodiments, the flakes can be ground into fine powders before being dispersed in the curable matrix material to form the EMI shielding composites. The CNS fine powders may have an average diameter in the range, for example, from about 0.1 micron to about 10 microns, or from about 0.5 microns to about 5 microns. It is to be understood that the grinding process may reduce the size of the particles without changing the CNS encapsulated structure at a microscopic scale.

In some embodiments, the CNS fine powders can be mixed with magnetic and/or dielectric fillers, and the mixture can be dispersed in a curable matrix material to form EMI shielding composites. The composition of formed EMI shielding composites may include, for example, about 30 to about 90 wt %, or about 50 to about 80 wt % of magnetic fillers. The magnetic fillers can include, for example, a ferromagnetic or ferrimagnetic material including doped or undoped carbonyl iron powder (CIP), iron silicide, ceramic magnetic ferrite, ceramic magnetic garnet, or combinations thereof. A suitable dispersant may be added during the mixing.

In some embodiments, EMI shielding composites may further include, for example, about 30 to about 90 wt %, or about 50 to about 80 wt % of dielectric fillers. The dielectric filler may include doped or undoped TiO, CuO, SiC, or mixtures thereof.

In some embodiments, the EMI shielding composites may further include, for example, about 30 to about 90 wt %, or about 50 to about 80 wt % of multiferroic fillers such as, for example, $BiFeO_3$, $BiMnO_3$, or mixtures thereof.

Figure 1:
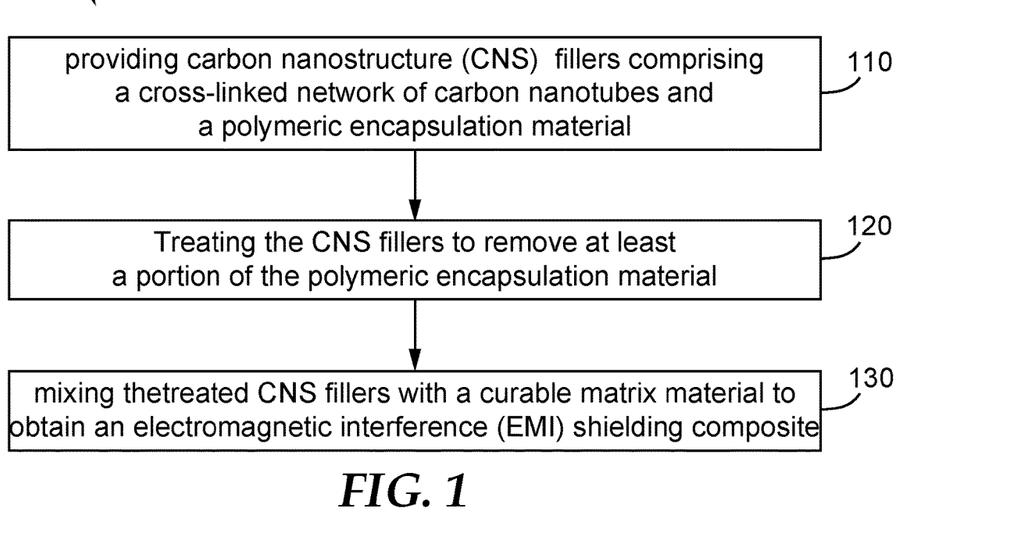
FIG. 1 is a flow diagram of a method for producing an EMI shielding composite, according to one embodiment.

The present disclosure provides methods of producing EMI shielding composites by making use of carbon nanostructure (CNS) fillers such as, for example, CNS encapsulated flakes or powders described above. The present disclosure further provides methods of adjusting properties of the EMI shielding composites by treating the CNS fillers. FIG. 1 illustrates a flow diagram of a method 100 for producing EMI shielding composite where CNS fillers are treated to at least partially remove the polymeric encapsulation material therefrom.

At 110, carbon nanostructure (CNS) fillers are provided. The CNS fillers include a cross-linked network of carbon nanotubes and a polymeric encapsulation material. The CNS fillers can be, for example, CNS encapsulated flakes or powders that include a multitude of cross-linked and entangled carbon nanotubes and one or more polymeric encapsulation materials. The carbon nanotubes may be at least partially encapsulated by the one or more polymeric encapsulation materials. The CNS encapsulated flakes can be ground into fine powders with reduced dimensions or sizes without changing the microscopic structures. The method 100 then proceeds to 120.

At 120, the CNS fillers are treated to remove at least a portion of the polymeric encapsulation material. After the removal of the polymeric encapsulation material, the carbon nanotubes may be at least partially exposed. In some embodiments, 50 wt % or more, 70 wt % or more, 90 wt % or more, 99 wt % or more, or 99.9 wt % or more of the polymeric encapsulation material may be removed from the CNS fillers. In some embodiments, the CNS fillers can be treated by a suitable solvent to dissolve and separate the respective polymeric encapsulation materials from the carbon nanotubes. In some embodiments, the polymeric encapsulation material may include polyethylene glycol (PEG), and the solvent may include water to dissolve the PEG encapsulation. In some embodiments, the polymeric encapsulation material may include polyurethane (PU) and the solvent may include N,N-Dimethylformamide (DMF) to dissolve the PU encapsulation. In some embodiments, the polymeric encapsulation material may include polyamide and the solvent may include ethanol to dissolve the polyamide encapsulation. It is to be understood that the polymeric encapsulation material may include other types of polymers, and one or more suitable solvents can be used to dissolve the respective polymeric encapsulation materials and thereby remove the polymeric encapsulation material from the CNS fillers. The method 100 then proceeds to 130.

At 130, the treated CNS fillers are mixed with a curable matrix material to obtain an electromagnetic interference (EMI) shielding composite. In some embodiments, the matrix material may include a curable polymer material such as, for example, epoxy, silicone, polycarbonate, polyester, polyurethane resin, etc. The EMI shielding composite can include, for example, 0.05 to 10 wt %, or 0.1 to 5 wt % of the CNS fillers. The CNS fillers can be dispersed in the curable matrix material with a density in the range, for example, from about 0.1 to about 25 $g/cm^3$, from about 0.3 to about 10 $g/cm^3$, or from about 0.5 to about 5.0 $g/cm^3$. In some embodiments, the CNS fillers can be uniformly dispersed in the curable matrix material to form a homogenous composite. In some embodiments, the CNS fillers can be unevenly dispersed in the curable matrix material. For example, a graded layer approach may be taken where the CNS fillers and/or other magnetic/dielectric fillers have a graded distribution so that the EMI composite is compositionally graded to reduce impedance mismatch between the EMI composite and free space. In some embodiments, other types of fillers including, for example, magnetic fillers, dielectric fillers, mixtures thereof, etc., can be mixed with the CNS fillers and dispersed into the curable matrix material to achieve desired thermal, mechanical, electrical, magnetic, or dielectric properties.

Some embodiments described herein provide methods of modifying properties of EMI shielding composites by treating the CNS fillers to remove the polymeric encapsulation material therefrom. An original EMI shielding composite may include carbon nanostructure (CNS) fillers and a matrix material. The CNS fillers may include CNS encapsulated flakes or powders where cross-linked carbon nano tubes are encapsulated by one or more polymeric encapsulation materials. The CNS fillers can be mixed with a curable matrix material, and after curing, the original EMI shielding composite can be formed. To modify the EMI properties of the original EMI shielding composite, the CNS fillers can be treated with a solvent to remove at least a portion of the polymeric encapsulation material before dispersing into the curable matrix material and curing. The modified EMI shielding composite can include, for example, about 0.05 to about 10 wt %, about 0.1 to about 5 wt %, or about 0.2 to about 3 wt % of the treated CNS fillers dispersed in the matrix material. In some embodiments, the modified EMI shielding composite can include, for example, about 5 wt % or less, 3 wt % or less, 2 wt % or less, or even 1 wt % or less of the treated CNS fillers.

The original EMI shielding composite has a first dielectric permittivity with a real part and an imaginary part. In some embodiments, the values of the imaginary part ($\varepsilon''$) of the first permittivity may be, for example, 5% or more, 10% or more, 20% or more, 30% or more, or 50% or more, higher than the values of the real part ($\varepsilon'$) of the first permittivity in the majority of the frequency range of 0.1 to 75 GHz. The modified EMI shielding composite has a second dielectric permittivity with a real part ($\varepsilon'$) and an imaginary part ($\varepsilon''$). In some embodiments, the values of the imaginary part of the second permittivity may be, for example, 1% or more, 2% or more, 5% or more, or 10% or more, higher than the values of the real part of the second permittivity when the frequency is higher than a critical value. The values of the imaginary part of the second permittivity may be, for example, 1% or more, 5% or more, 10% or more, or 20% or more, lower than the values of the real part of the second permittivity when the frequency is lower than a critical value. The critical value can be in a frequency range of, for example, 3 to 20 GHz, or 5 to 15 GHz.

In some embodiments, the modified EMI shielding composite may have a relatively lower dielectric permittivity values than the original EMI shielding composite in a frequency range, for example, 0.1 to 75 GHz. In some embodiments, the values of dielectric permittivity of the modified composite may be, for example, 5% or more, 10% or more, 30% or more, 50% or more, 80% or more, or 100% or more, lower than the values of dielectric permittivity of the original composite. In some embodiments, the values of dielectric permittivity may decrease more in the lower end (e.g., 0.1 to 5 GHz) of the frequency range than in the higher end (e.g., 5 to 75 GHz).

The observed decrease of dielectric permittivity values for the modified EMI shielding composite in some embodiments is unexpected. It is well known in the literature that an electrically insulating polymer encapsulation material on a conductive filler will decrease the dielectric polarization and therefore show lower values of real and imaginary parts of permittivity (i.e., $\varepsilon'$ and $\varepsilon''$ values). See, for example, *High-k polymer/carbon nanotube composites based on a polyhedral oligomeric silsesquioxane matrix facilitated by ionic liquid*, J. Mater. Chem. C, 2014, 2, 8216, and *Effects of Nano-Alumina Hydrate Coating for Conductive Fillers on Dielectric Properties of Epoxy Composite Materials*, Proceedings of 2014 International Symposium on Electrical Insulating Materials (ISEIM), p 77-80, DOI:10.1109/ISEIM.2014.6870724. In the modified composites according to some embodiments, the removal of polymeric encapsulation material from the CNS fillers by treating the CNS fillers decreases the dielectric permittivity values of the composite including the treated CNS fillers.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Listing of Exemplary Embodiments

Embodiment 1 is a method comprising:
providing carbon nanostructure (CNS) fillers comprising a plurality of cross-linked carbon nanotubes and one or more polymeric encapsulation materials, the carbon nanotubes at least being partially encapsulated by the one or more polymeric encapsulation materials;
removing at least a portion of the polymeric encapsulation materials from the CNS fillers; and
after removing the polymeric encapsulation material, mixing the fillers with a curable matrix material to obtain an electromagnetic interference (EMI) shielding composite.

Embodiment 2 is the method of embodiment 1, wherein removing the polymeric encapsulation materials comprises treating the CNS fillers in a solvent to dissolve and separate the polymeric encapsulation material from the carbon nanotubes.

Embodiment 3 is the method of embodiment 2, wherein the polymeric encapsulation materials include polyethylene glycol (PEG), and the solvent includes water.

Embodiment 4 is the method of embodiment 2 or 3, wherein the polymeric encapsulation materials include polyurethane (PU) and the solvent includes N,N-Dimethylformamide (DMF).

Embodiment 5 is the method of any one of embodiments 2-4, wherein the polymeric encapsulation materials include polyamide and the solvent includes ethanol.

Embodiment 6 is the method of any one of embodiments 1-5, wherein the CNS fillers are provided by grinding CNS encapsulated flakes into fine powders having an average dimension in the range from about 0.5 to about 5 microns.

Embodiment 7 is the method of any one of embodiments 1-6, wherein the carbon nanotubes are electrically conducting, and the polymeric encapsulation materials are electrically insulating.

Embodiment 8 is the method of any one of embodiments 1-7, wherein the CNS fillers have a composition comprising about 0.1 to about 15 wt % of the polymeric encapsulation material.

Embodiment 9 is the method of any one of embodiments 1-8, wherein the CNS fillers have a composition comprising about 85 to about 99.9 wt % of the carbon nanotubes.

Embodiment 10 is the method of any one of embodiments 1-9, wherein the EMI shielding composite has a composition comprising 0.1 to 5 wt % of the CNS fillers.

Embodiment 11 is the method of any one of embodiments 1-10, wherein the curable matrix material includes a curable polymer material including epoxy, silicone, polycarbonate, polyurethane, or polyester resin.

Embodiment 12 is the method of any one of embodiments 1-11, further comprising curing the curable matrix material by heat or radiation.

Embodiment 13 is the method of any one of embodiments 1-12, further comprising mixing a magnetic filler with the CNS fillers after removing the polymeric encapsulation material.

Embodiment 14 is the method of any one of embodiments 1-13, wherein the magnetic filler comprises a ferromagnetic or ferrimagnetic material including doped or undoped carbonyl iron powder (CIP), iron silicide, ceramic magnetic ferrite, ceramic magnetic garnet, or combinations thereof.

Embodiment 15 is the method of embodiment 13, wherein the EMI shielding composite has a composition comprising about 30 to about 90 wt % of the magnetic filler.

Embodiment 16 is the method of embodiment 15, wherein the composition of the EMI shielding composite comprises about 50 to about 80 wt % of the magnetic filler.

Embodiment 17 is the method of any one of embodiments 1-16, wherein the EMI shielding composite has a composition comprising 50 to 90 wt % of a dielectric filler.

Embodiment 18 is the method of embodiment 17, wherein the ceramic dielectric material includes doped or undoped TiO, CuO, SiC, or $BiFeO_3$ or mixtures thereof.

Embodiment 19 is a method of adjusting properties of an original EMI shielding composite, the original EMI shielding composite comprising carbon nanostructure (CNS) fillers and a matrix material, the CNS fillers being distributed within the matrix material, the CNS fillers comprising a plurality of cross-linked carbon nanotubes and a polymeric encapsulation material encapsulating at least some of the carbon nanotubes, the method comprising:
providing the CNS fillers comprising the carbon nanotubes and the polymeric encapsulation material, the carbon nanotubes being encapsulated by the polymeric encapsulation material;
treating the CNS fillers with a solvent to remove at least a portion of the polymeric encapsulation material from the CNS fillers; and
after removing the polymeric encapsulation material, mixing the CNS fillers with the matrix material to obtain a modified EMI shielding composite, wherein the modified EMI shielding composite comprises about 0.1 to about 5 wt % of the treated CNS fillers dispersed in the matrix material.

Embodiment 20 is the method of embodiment 19, wherein the modified EMI shielding composite has relatively lower dielectric permittivity values than the original EMI shielding composite in a frequency range of 0.1 to 75 GHz.

Embodiment 21 is the method of embodiment 19 or 20, wherein the original EMI shielding composite has a first dielectric permittivity with a real part and an imaginary part, the modified EMI shielding composite has a second dielectric permittivity with a real part and an imaginary part, the values of the imaginary part of the first permittivity is higher than the values of the real part of the first permittivity in a majority frequency range of 0.1 to 75 GHz, and the values of the imaginary part of the second permittivity is higher than the values of the real part of the second permittivity when the frequency is higher than a critical value that is in a frequency range of 6 to 18 GHz.

Embodiment 22 is the method of any one of embodiment 19-21, wherein removing the polymeric encapsulation materials comprises treating the CNS fillers in a solvent to dissolve and separate the polymeric encapsulation material from the carbon nanotubes.

Embodiment 23 is the method of embodiment 22, wherein the polymeric encapsulation materials include polyethylene glycol (PEG), and the solvent includes water.

Embodiment 24 is the method of embodiment 22 or 23, wherein the polymeric encapsulation materials include polyurethane (PU) and the solvent includes N,N-Dimethylformamide (DMF).

Embodiment 25 is the method of embodiment 22, 23 or 24, wherein the polymeric encapsulation materials include polyamide and the solvent includes ethanol.

Embodiment 26 is the method of any one of embodiments 19-25, wherein the CNS fillers are provided by grinding CNS encapsulated flakes into fine powders having an average dimension in the range from about 0.5 to about 5 microns.

Embodiment 27 is the method of any one of embodiments 19-26, wherein the carbon nanotubes are electrically conducting, and the polymeric encapsulation materials are electrically insulating.

Embodiment 28 is the method of any one of embodiments 19-27, wherein the CNS fillers have a composition comprising about 0.1 to about 15 wt % of the polymeric encapsulation material.

Embodiment 29 is the method of any one of embodiments 19-28, wherein the CNS fillers have a composition comprising about 85 to about 99.9 wt % of the carbon nanotubes.

Embodiment 30 is the method of any one of embodiments 19-29, wherein the curable matrix material includes a curable polymer material including epoxy, silicone, polycarbonate, polyurethane, or polyester resin.

Embodiment 31 is the method of any one of embodiments 19-30, further comprising curing the curable matrix material by heat or radiation.

Embodiment 32 is the method of any one of embodiments 19-31, further comprising mixing a magnetic filler with the CNS fillers after removing the polymeric encapsulation material.

Embodiment 33 is the method of any one of embodiments 19-32, wherein the magnetic filler comprises a ferromagnetic or ferrimagnetic material including doped or undoped carbonyl iron powder (CIP), iron silicide, ceramic magnetic ferrite, ceramic magnetic garnet, or combinations thereof.

Embodiment 34 is the method of embodiment 32, wherein the EMI shielding composite has a composition comprising about 30 to about 90 wt % of the magnetic filler.

Embodiment 35 is the method of embodiment 34, wherein the composition of the EMI shielding composite comprises about 50 to about 80 wt % of the magnetic filler.

Embodiment 36 is the method of any one of embodiments 19-35, wherein the EMI shielding composite has a composition comprising 50 to 90 wt % of a dielectric filler.

Embodiment 37 is the method of embodiment 36, wherein the ceramic dielectric material includes doped or undoped $TiO$, $CuO$, $SiC$, or $BiFeO_3$ or mixtures thereof.

Embodiment 38 is an EMI shielding composite comprising:
  carbon nanostructure (CNS) fillers comprising a plurality of electrically conductive, cross-linked carbon nanotubes;
  a matrix material, the CNS fillers being dispersed in the matrix material,
  wherein the EMI shielding composite comprises about 0.1 to about 5 wt % of the treated CNS fillers.

Embodiment 39 is the composite of embodiment 38, wherein the EMI shielding composite has a dielectric permittivity with a real part and an imaginary part, and the values of the imaginary part of the permittivity is higher than the values of the real part of the permittivity when the frequency is higher than a critical value that is in a frequency range of 6 to 18 GHz.

Embodiment 40 is the composite of embodiment 38 or 39, wherein the CNS fillers further comprises about 0.1 wt % or less of polymeric encapsulation materials.

Embodiment 41 is the composite of any one of embodiments 38-40, wherein the matrix material is formed by curing a curable matrix material including a curable polymer material including epoxy, silicone, polycarbonate, polyurethane, or polyester resin.

Embodiment 42 is the composite of any one of embodiments 38-41, further comprising a magnetic filler.

Embodiment 43 is the composite of any one of embodiments 38-42, wherein the magnetic filler comprises a ferromagnetic or ferrimagnetic material including doped or undoped carbonyl iron powder (CIP), iron silicide, ceramic magnetic ferrite, ceramic magnetic garnet, or combinations thereof.

Embodiment 44 is the composite of embodiment 42 or 43, wherein the composition of the EMI shielding composite comprises about 30 to about 90 wt % of the magnetic filler.

Embodiment 45 is the composite of embodiment 44, wherein the composition of the EMI shielding composite comprises about 50 to about 80 wt % of the magnetic filler.

Embodiment 46 is the composite of any one of embodiments 38-45, wherein the composition of the EMI shielding composite comprises 50 to 90 wt % of a dielectric filler.

Embodiment 47 is the composite of embodiment 46, wherein the dielectric material includes doped or undoped $TiO$, $CuO$, $SiC$, or $BiFeO_3$ or mixtures thereof.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. In addition, Table 1 provides abbreviations and a source for all materials used in the Examples below:

TABLE 1

| Abbreviation | Description | Source |
| --- | --- | --- |
| CNS Encapsulated Flakes | flakes, about 70 microns long, 10 microns thick | Applied NanoStructured Solutions, LLC, Baltimore, MD |
| Epoxy | 2 part epoxy, Devcon 5 minute epoxy | ITW Devcon, Danvers, MA |
| CIP | carbonyl iron powders, EW-I grade | BASF Corporation Evans City, PA |
| Collodial Silica | Powders | Nalco, Bedford Park, IL |
| Isoctyltrimethoxy silane | Liquid | Gelest, Morrisville, PA |
| Methyltrimethoxy silane | Liquid | Gelest, Morrisville, PA |
| Ethanol 80:20 | Liquid | EMD, Gibbstown, NJ |
| Methanol | Liquid | VWR, West Chester, PA |

Test Methods

The following test methods have been used in evaluating some of the Examples of the present disclosure. S parameters were obtained using an Agilent E8363C Network Analyzer from Agilent Technologies, Santa Clara, Calif., coupled with Model M07T from Damaskos Inc., Concordville, Pa. Complex dielectric and magnetic properties were calculated over the frequency range of 0.1 to 18 GHz from the measured S parameters. Air Coax test fixture using the doughnut shaped samples at room temperature.

Example 1

CNS encapsulated flakes commercially available from Applied NanoStructured Solutions, LLC, Baltimore, Md., were ground to fine powders using mortar and pestle under dry conditions at room temperature. The CNS encapsulated flakes or powders include about 4 wt % of polymeric encapsulation material, polyethylene glycol (PEG) in this case, and about 96 wt % of cross-linked carbon nanostructures. The fine powders of CNS encapsulated flakes were directly mixed with CIP powders (Carbonyl Iron, commercially available from BASF) in a plastic jar.

About 1.0 wt % dispersant (5 nm hydrophobic nanosilica) was added into the mixture using dry speed mixing technique. The nanosilica dispersant was prepared as follows. A mixture of 100 grams of colloidal silica (16.06 wt % solids in water; 5 nm size), 7.54 grams of isoctyltrimethoxy silane, 0.81 grams of methyltrimethoxysilane and 112.5 grams of an 80:20 wt % solvent blend of ethanol:methanol were added to a 500 ml 3-neck round bottom flask (Ace Glass, Vineland, N.J.). The flask containing the mixture was placed in an oil bath set at 80° C. with stirring for 4 hours to prepare hydrophobically modified nanosilica particles. The hydrophobically modified nanosilica particles were transferred to a crystallizing dish and dried in a convection oven at 150° C. for 2 hours.

The final mixture of CNS encapsulated flakes, CIP powders, and the dispersant was added to epoxy (Devcon 5 minute epoxy commercially available from ITW Devcon, Danvers, Mass.), put in a speed mixer (DAC 150 FVZ, Siemens) and spun at rpm=2000 for 2 minutes) to form a composite sample. The mixture was placed in an oven pre-set at 80° C. for 4 hours for curing the epoxy. Once the epoxy composite was completely cured, the composite was taken out of the plastic jar (used as a mold). The composite includes about 0.7 wt % of the CNS encapsulated flake powders, about 70 wt % of the CIP powders, about 28.6 wt % of the epoxy, and about 0.7 wt % of the dispersant (Nanosilica). The composite sample was then machined into toroid or doughnut shaped samples with an outer diameter of 0.275 inch (0.70 cm), an inner diameter of 0.120 inch (0.30 cm), and a thickness of about 3-6 mm, for electromagnetic measurements.

Example 2

Example 2 was made the same way as Example 1 except that the fine powders of CNS encapsulated flakes were treated by a solvent to remove the polymeric encapsulation material before mixing with the CIP powders. CNS encapsulated flakes commercially available from Applied NanoStructured Solutions, LLC, Baltimore, Md., were ground to fine powders using mortar and pestle under dry conditions at room temperature. The CNS encapsulated flakes or powders include about 4 wt % of polymeric encapsulation material, polyethylene glycol (PEG) in this case, and about 96 wt % of cross-linked carbon nanostructures. The fine powders of CNS encapsulated flakes were put in a solvent (water in this case), stirred with magnetic bars on a hotplate at 110° C. to dissolve the PEG encapsulation and dried to isolate the CNS flake powders. The solvent-treated CNS flake powders were mixed with CIP powders (Carbonyl Iron, commercially available from BASF) in a plastic jar. About 1 wt % dispersant (5 nm hydrophobic nanosilica) was added into the mixture using dry speed mixing technique. The final mixture of treated CNS encapsulated flakes, CIP powders, and the dispersant was added to epoxy (Devcon 5 minute epoxy commercially available from ITW Devcon, Danvers, Mass.), put in a speed mixer (DAC 150 FVZ, Siemens) and spun at rpm=2000 for 2 minutes) to form a composite sample. The mix was placed in an oven pre-set at 80° C. for 4 hours for curing the epoxy. Once the epoxy composite was completely cured, the composite was taken out of the plastic jar (used as a mold). The composite includes about 0.7 wt % of the solvent-treated CNS encapsulated flake powders, about 70 wt % of the CIP powders, about 28.6 wt % of the epoxy, and about 0.7 wt % of the dispersant (Nanosilica). The composite sample was then machined into toroid or doughnut shaped samples with an outer diameter of 0.275 inch (0.70 cm), an inner diameter of 0.120 inch (0.30 cm), and a thickness of about 3-6 mm, for electromagnetic measurements.

Comparative Example

Comparative example was made the same way as Examples 1 and 2 except that no CNS encapsulated flakes or powders were added. CIP powders (Carbonyl Iron, commercially available from BASF) with about 1 wt % dispersant (5 nm hydrophobic nanosilica) were added to epoxy (Devcon 5 minute epoxy commercially available from ITW Devcon, Danvers, Mass.), put in a speed mixer (DAC 150 FVZ, Siemens) and spun at rpm=2000 for 2 minutes) to form a composite sample. The mix was placed in an oven pre-set at 80° C. for 4 hours for curing the epoxy. Once the epoxy composite was completely cured, the composite was taken out of the plastic jar (used as a mold). The composite includes about 80 wt % of the CIP powders, about 19.2 wt % of the epoxy, and about 0.8 wt % of dispersants (Nanosilica). The composite sample was then machined into toroid or doughnut shaped samples with an outer diameter of 0.275 inch (0.70 cm), an inner diameter of 0.120 inch (0.30 cm), and a thickness of about 3-6 mm, for electromagnetic measurements.

Figure 2:
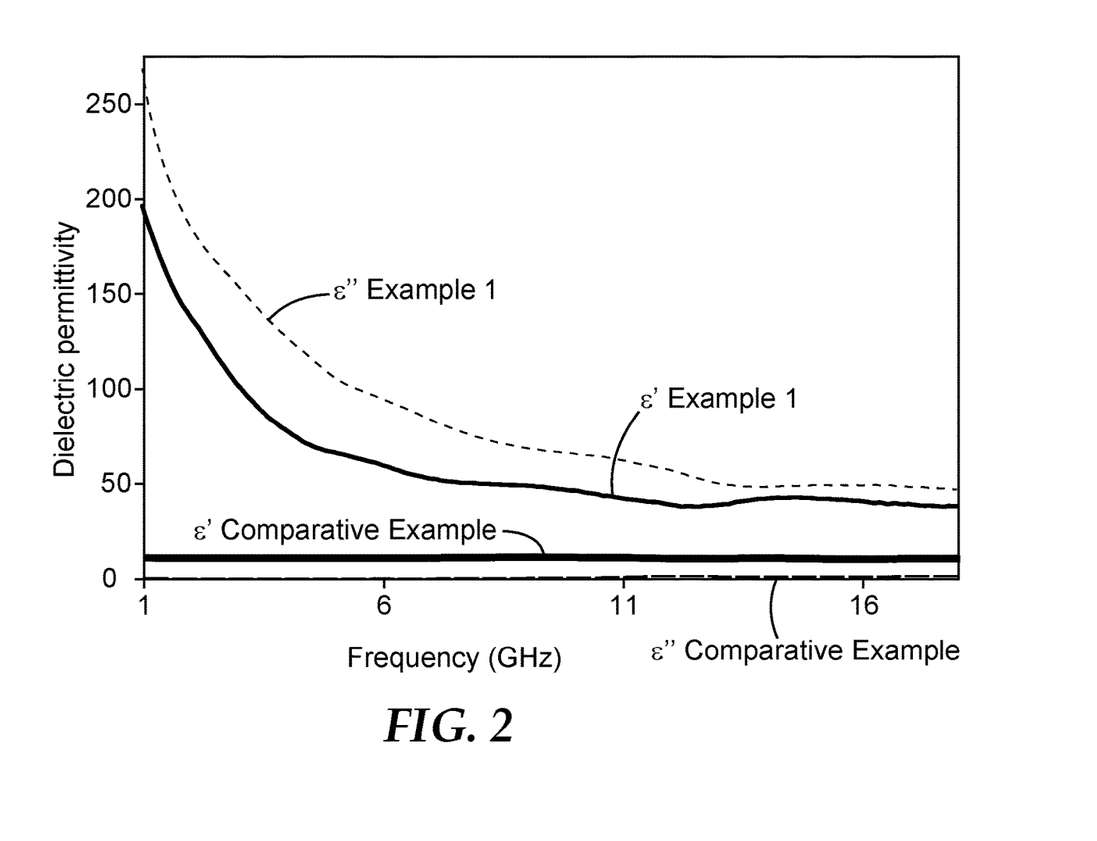
FIG. 2 illustrates test results for Example 1 showing plots for real and imaginary parts of dielectric permittivity versus frequency.

FIG. 2 illustrates test results for Example 1 and Comparative Example, showing respective plots for real and imaginary parts ($\varepsilon'$ and $\varepsilon''$) of dielectric permittivity versus frequency. Example 1 exhibits significantly higher values of imaginary part of permittivity ($\varepsilon''$) compared to Comparative Example. With the loading of about 0.7 wt % CNS encapsulated flakes, Example 1 shows $\varepsilon''$ (dielectric loss) values that are about 30 to about 50 times higher than the composite of Comparative Example. For Example 1, at the whole frequency range (e.g., 1 to 18 GHz), the imaginary part of dielectric permittivity that represents dielectric loss ($\varepsilon''$ values) are higher than the real part of dielectric permittivity ($\varepsilon'$ values).

Figure 3:
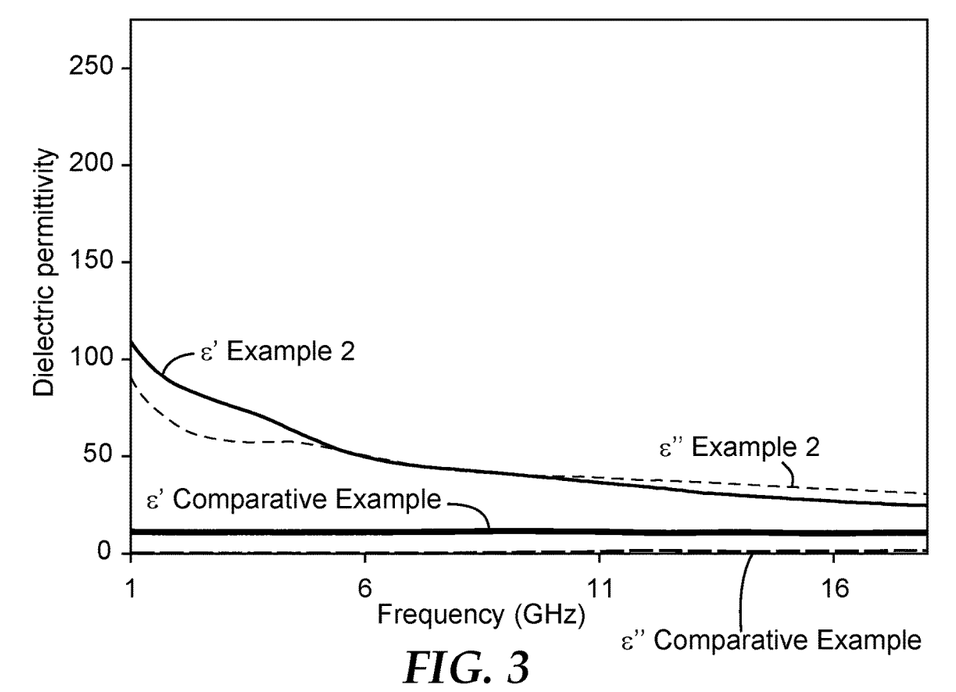
FIG. 3 illustrates test results for Example 2 showing plots for real and imaginary parts of dielectric permittivity versus frequency.

FIG. 3 illustrates test results for Example 2 and Comparative Example, showing respective plots for real and imaginary parts of dielectric permittivity versus frequency. With the loading of about 0.7 wt % solvent-treated CNS encapsulated flakes, Example 2 shows $\varepsilon''$ (dielectric loss) values that are about 20 to about 30 times higher than the composite of Comparative Example. For Example 2, at higher frequency ranges (e.g., f>6 GHz), the $\varepsilon''$ values are higher than $\varepsilon'$ values.

Comparing Example 2 of FIG. 3 to Example 1 of FIG. 2, it was found that Example 2 has diminished dielectric polarization characteristics (e.g., lower $\varepsilon'$ and $\varepsilon''$ values). That is, removing the polymeric encapsulation material from the CNS flakes modified the dielectric properties of the final samples, more particularly, by decreasing the $\varepsilon'$ and $\varepsilon''$ values.

Figure 4:
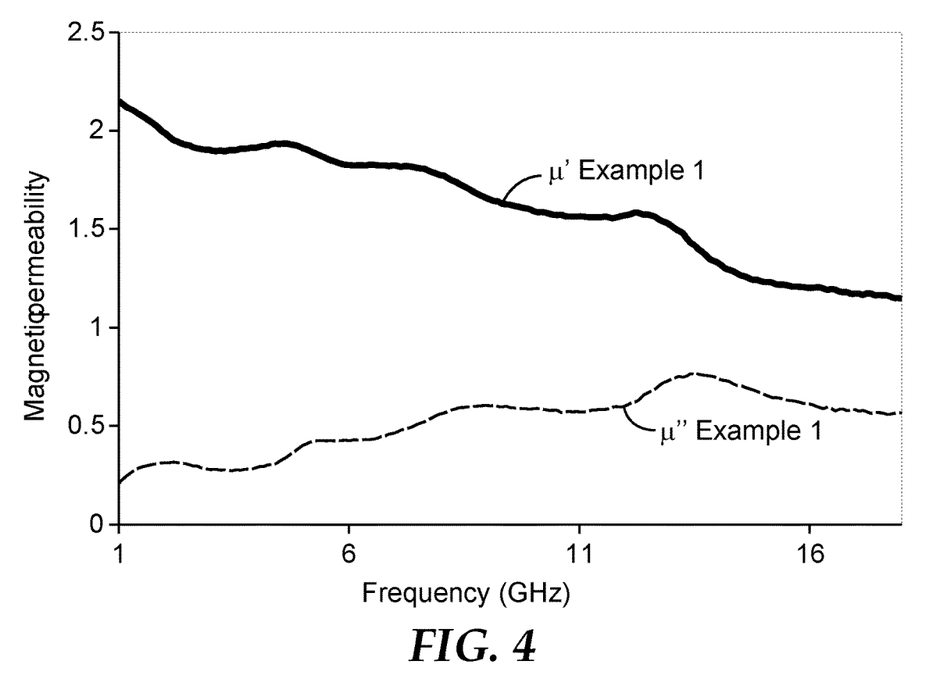
FIG. 4 illustrates test results for Example 1 showing plots for real and imaginary parts of magnetic permeability versus frequency.

FIG. 4 shows the magnetic characteristics (real and imaginary parts and $\mu'$ and $\mu''$ of magnetic permeability versus frequency) of Example 1. The exhibited magnetic characteristics are dues to the presence of the CIP fillers which are ferromagnetic in nature. CNS flakes are carbon based materials and are nonmagnetic in nature. Adding the CNS flakes to magnetic fillers such as CIP, magnetic ferrites, magnetic garnets, etc., allows the composites to exhibit both dielectric loss (for far field applications) and magnetic loss (for near field applications). Example 2 exhibited similar magnetic characteristics as Example 1.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about." Furthermore, various exemplary embodiments have been described. These and other embodiments are within the scope of the following claims.

What is claimed is:

1. A method of making a modified electromagnetic interference EMI shielding composite, the modified EMI shielding composite having adjusted properties as compared to an original EMI shielding composite, the method comprising:
    providing carbon nanostructure (CNS) fillers, the CNS fillers being in the form of flakes or powders and each comprising a plurality of networks of cross-linked multiwall carbon nanotubes and one or more polymeric encapsulation materials, the cross-linked multiwall carbon nanotubes each having a surface area being at least partially covered by the one or more polymeric encapsulation materials, wherein the networks of cross-linked multiwall carbon nanotubes are electrically conducting, and the polymeric encapsulation materials are electrically insulating;
    treating the CNS fillers to remove at least a portion of the polymeric encapsulation materials from the CNS fillers such that the networks of cross-linked multiwall carbon nanotubes are least partially exposed;
    providing a curable matrix material, and
    after removing the polymeric encapsulation material, mixing the treated CNS fillers with the curable matrix material to obtain the modified electromagnetic interference (EMI) shielding composite,
    wherein the modified EMI shielding composite has relatively lower dielectric permittivity values than the original EMI shielding composite in a frequency range of 0.1 to 75 GHz, the original EMI shielding composite is formed by mixing, via substantially the same process as the mixing for the modified EMI shielding composite, a second carbon nanostructure (CNS) fillers substantially the same as the CNS fillers of the modified EMI shielding composite before the treating and a second curable matrix material substantially the same as the curable matrix material of the modified EMI shielding composite, in substantially the same amounts as for the modified EMI shielding composite.

2. The method of claim 1, wherein removing the polymeric encapsulation materials comprises treating the CNS fillers in a solvent to dissolve and separate the polymeric encapsulation materials from the carbon nanotubes.

3. The method of claim 2, wherein the polymeric encapsulation materials include polyethylene glycol (PEG), and the solvent includes water.

4. The method of claim 2, wherein the polymeric encapsulation materials include polyurethane (PU), and the solvent includes N,N-Dimethylformamide (DMF).

5. The method of claim 2, wherein the polymeric encapsulation materials include polyamide, and the solvent includes ethanol.

6. The method of claim 1, wherein the CNS fillers are provided by grinding CNS encapsulated flakes into fine powders having an average dimension in the range from about 0.5 to about 5 microns.

7. The method of claim 1, wherein the CNS fillers have a composition comprising about 0.1 to about 15 wt % of the polymeric encapsulation materials.

8. The method of claim 7, wherein the CNS fillers have a composition comprising about 85 to about 99.9 wt % of the carbon nanotubes.

9. The method of claim 1, wherein the modified EMI shielding composite has a composition comprising 0.1 to 5 wt % of the CNS fillers.

10. The method of claim 1, wherein the curable matrix material includes a curable polymer material including epoxy, silicone, polycarbonate, polyurethane, or polyester resin.

11. The method of claim 1, further comprising curing the curable matrix material by heat or radiation.

* * * * *